(12) United States Patent
Miyake et al.

(10) Patent No.: US 6,504,896 B2
(45) Date of Patent: *Jan. 7, 2003

(54) X-RAY ILLUMINATION OPTICAL SYSTEM AND X-RAY REDUCTION EXPOSURE APPARATUS

(75) Inventors: Akira Miyake, Utsunomiya; Masami Tsukamoto, Yokohama, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,373

(22) Filed: Aug. 26, 1997

(65) Prior Publication Data

US 2002/0003855 A1 Jan. 10, 2002

(30) Foreign Application Priority Data

Aug. 26, 1996 (JP) .............................................. 8-223614

(51) Int. Cl.[7] .................................................. G21K 5/00
(52) U.S. Cl. .......................................................... 378/34
(58) Field of Search ............................................ 378/34

(56) References Cited

U.S. PATENT DOCUMENTS 5,677,939 A * 10/1997 Oshino ........................ 378/84

* cited by examiner

*Primary Examiner*—Craig E. Church
(74) *Attorney, Agent, or Firm*—Fitzpatrick, Cella, Harper & Scinto (57) ABSTRACT

An X-ray illumination optical system includes a reflection type integrator, having cylindrical surfaces, for reflecting an X-ray beam, and a concave mirror, including a rotational parabolic surface mirror, for reflecting the X-ray beam reflected by the integrator and for illuminating an object with the X-ray beam.

31 Claims, 10 Drawing Sheets

X-RAY ILLUMINATION OPTICAL SYSTEM AND X-RAY REDUCTION EXPOSURE APPARATUS

FIELD OF THE INVENTION AND RELATED ART

This invention relates to an X-ray illumination optical system and an X-ray reduction exposure apparatus using the same and, in another aspect, it relates to a device manufacturing method using such an X-ray reduction exposure apparatus.

An X-ray reduction projection exposure process is used for the manufacture of microdevices such as semiconductor circuit devices, having fine patterns. In such a process, a mask having a circuit pattern formed thereon is illuminated with X-rays and an image of the pattern of the mask is projected, in a reduced scale, on the surface of a wafer. A resist on the wafer surface is sensitized, whereby the pattern is transferred and printed thereon.

Figure 12:
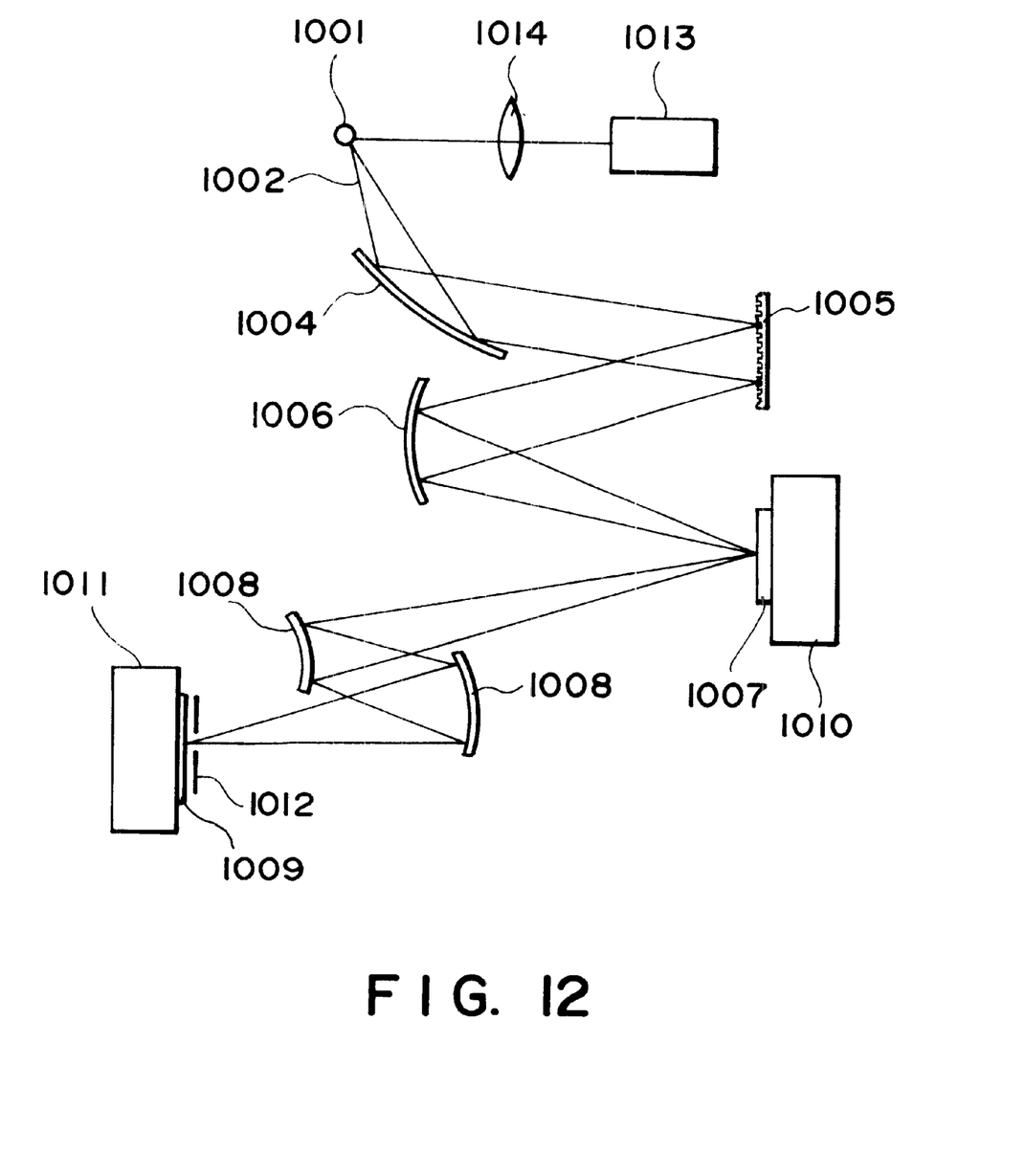
FIG. 12 is a schematic view of an X-ray reduction projection exposure apparatus of a known type.
Figure 13:
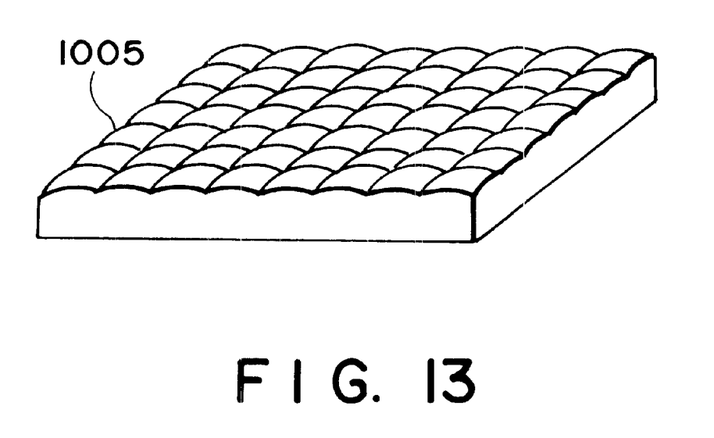
FIG. 13 is a schematic and perspective view of a reflection type integrator of a known type.
Figure 14:
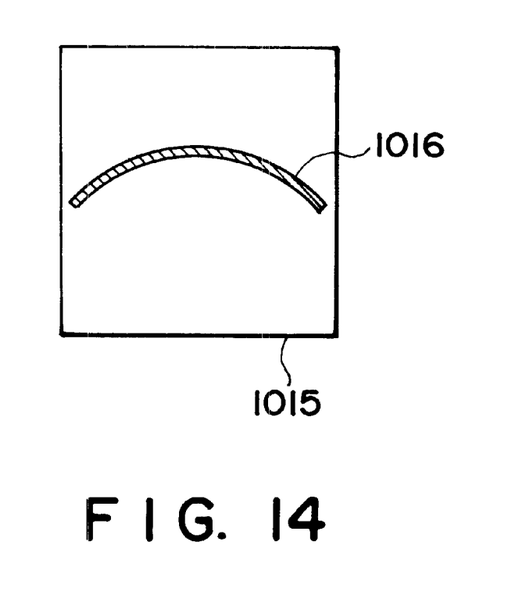
FIG. 14 is a schematic view for explaining an illumination region on the surface of a mask.

FIG. 12 is a schematic view of a known example of an X-ray reduction projection exposure apparatus, FIG. 13 is a schematic and perspective view of a reflection type integrator, and FIG. 14 is a schematic view for explaining an illumination region upon the surface of a mask. In these drawings, denoted at 1001 is a light emission point for X-rays, and denoted at 1002 is an X-ray beam. Denoted at 1004 is a first rotational parabolic surface mirror, and denoted at 1005 is a reflection type integrator. Denoted at 1006 is a second rotational parabolic surface mirror, and denoted at 1007 is a mask. Denoted at 1008 is a projection optical system, and denoted at 1009 is a wafer. Denoted at 1010 is a mask stage, and denoted at 1011 is a wafer stage. Denoted at 1012 is an arcuate aperture, and denoted at 1013 is a laser light source. Denoted at 1014 is a laser collecting optical system, and denoted at 1015 is an illumination region defined on the surface of the mask. Denoted at 1016 is an arcuate region within which the exposure is performed.

An X-ray light source may comprise a laser plasma or an undulator. In the illumination optical system, X-rays from the light source are collected by means of the first rotational parabolic surface mirror 1004, and the collected X-ray beam is projected on the reflection type integrator 1005, whereby secondary light sources are formed. X-rays from these secondary light sources are collected by means of the second rotational parabolic surface mirror 1006, to illuminate the mask 1007.

The mask 1007 comprises a multilayered film reflection mirror on which non-reflective portions are defined by use of an X-ray absorptive material, for example, whereby a transfer pattern is formed thereon. X-rays reflected by the mask 1007 are imaged by the projection optical system 1008 upon the surface of the wafer 1009. The projection optical system 1008 is designed so as to provide good imaging performance with respect to a narrow arcuate region off the optical axis. In order that the exposure is performed only by use of this narrow arcuate region, an aperture 1012 having an arcuate opening is disposed just before the wafer 1009. For the pattern transfer to the whole surface of the mask having a rectangular shape, the exposure process is performed while scanningly moving the mask 1007 and the wafer 1009 simultaneously.

The reflection type integrator 1005 may comprise a fly's-eye mirror having a number of small spherical surfaces arrayed two-dimensionally, as is best seen in FIG. 13, which are adapted to define a number of secondary light sources.

Here, if the spatial extension of the secondary light source group is d, the angular extension of X-rays emitted from each secondary light source is θ, and the focal length of the second parabolic surface mirror 1006 is f, then the size of the illumination region 1015 on the mask 1007 surface is f×θ and the angular extension of X-rays illuminating a single point on the mask is d/f.

As a parameter which represents the characteristic of the illumination optical system, there is a coherence factor σ. If the mask-side numerical aperture of the projection optical system 1008 is NAp1, and the mask-side numerical aperture of the illumination optical system is NAi, the coherence factor can be defined as follows:

$$\sigma = NAi/NAp1$$

The optimum value of σ is determined by the required resolution and contrast. Generally, if the factor σ is too small, an interference pattern appears at the edge portion of an image of a fine pattern as projected on the wafer 1009. If the factor σ is too large, the contrast of the projected image reduces.

If σ is zero, it is called coherent illumination. Regarding the transfer function OTF of the optical system, a constant value will be shown up to a particular spatial frequency as can be given by NAp2/λ where NAp2 is the wafer-side numerical aperture of the projection optical system and λ is the wavelength of the X-ray beam. For a higher frequency above the particular frequency, it becomes equal to zero, and resolving is not attainable.

If, on the other hand, σ is equal to 1, it is called incoherent illumination. The transfer function OTF reduces with an increase in the spatial frequency, but it does not become equal to zero unless a particular spatial frequency given by 2×NAp2/σ is reached. Thus, a more fine pattern can be resolved. In X-ray exposure, an optimum value of σ may be selected in accordance with the shape or size of a pattern to be transferred, or the characteristic of a resist process to be adopted. Usually, a value such as σ=0.1–1.0 may be set.

SUMMARY OF THE INVENTION

There is a problem to be solved, in conventional X-ray reduction projection exposure apparatuses. That is, as shown in FIG. 14, the illumination region 1015 on the mask surface has a rectangular shape or an elliptical shape, including an arcuate region 1016 through which the exposure is actually made. Thus, the region outside the exposure region is illuminated with many X-rays. These X-rays are not contributable to the exposure process, and they are wasteful. The loss of X-ray light quantity is large and it leads to prolongation of the exposure time. Thus, the throughput is low.

It is accordingly an object of the present invention to provide an X-ray reduction exposure apparatus and/or an X-ray illumination optical system therefor, by which the loss of light quantity can be very small, the exposure time can be shortened, and the throughput can be improved.

It is another object of the present invention to provide a device manufacturing method based on such an X-ray reduction exposure apparatus.

In accordance with an aspect of the present invention, there is provided an X-ray illumination optical system, comprising: a reflection type integrator having cylindrical surfaces, for reflecting an X-ray beam; and a concave mirror for reflecting the X-ray beam reflected by said integrator and for illuminating an object with the X-ray beam.

The system may further comprise a second concave mirror for projecting a parallel X-ray beam onto said integrator.

Said integrator may provide a secondary light source and said concave mirror may have a focal point which is disposed at the position of said secondary light source.

Said concave mirror may have a reflection surface of a rotational parabolic shape.

An axis of said cylindrical surface of said integrator and an axis of the X-ray beam impinging on said integrator may be placed on the same plane.

There may be an illumination region defined on the object, having an arcuate shape.

Said integrator may have a reflection surface on which a multilayered film is formed.

The illumination of the object may substantially satisfy the conditions for Koehler illumination.

The X-ray beam may comprise one of a beam emitted from a laser plasma X-ray source and a beam emitted from an undulator X-ray source.

In accordance with another aspect of the present invention, there is provided an X-ray reduction exposure apparatus, comprising: an X-ray illumination optical system as discussed above, for illuminating a mask having a pattern; and an X-ray reduction projection optical system for projecting, in a reduced scale, the pattern of the mask, as illuminated, onto the surface of a wafer.

The apparatus may further comprise scanning means for relatively scanningly moving the mask and the wafer relative to said X-ray reduction projection optical system, at a predetermined speed ratio.

In accordance with a further aspect of the present invention, there is provided a method of manufacturing a device by use of an X-ray reduction exposure apparatus as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
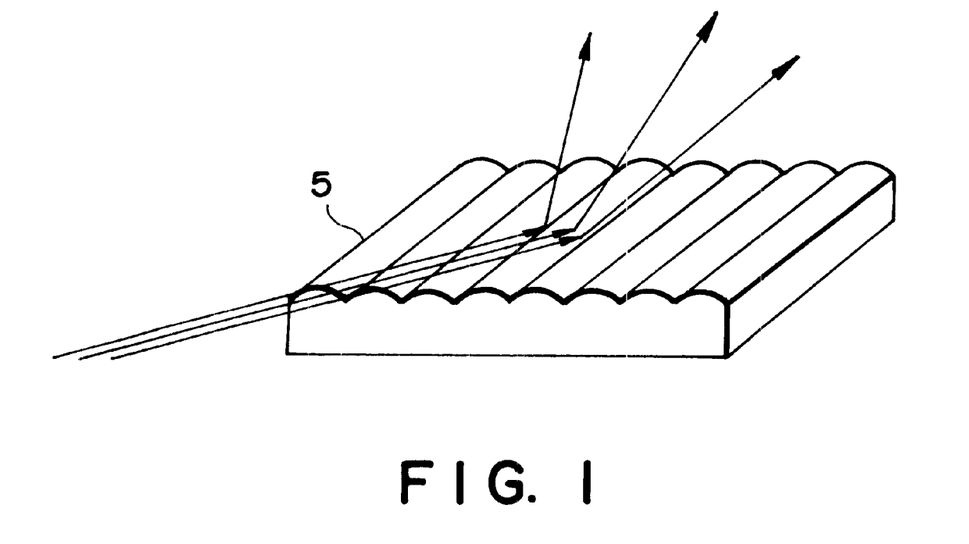
FIG. 1 is a schematic and perspective view for explaining reflection of parallel light impinging on a reflection type integrator having convex cylindrical surfaces.
Figure 2:
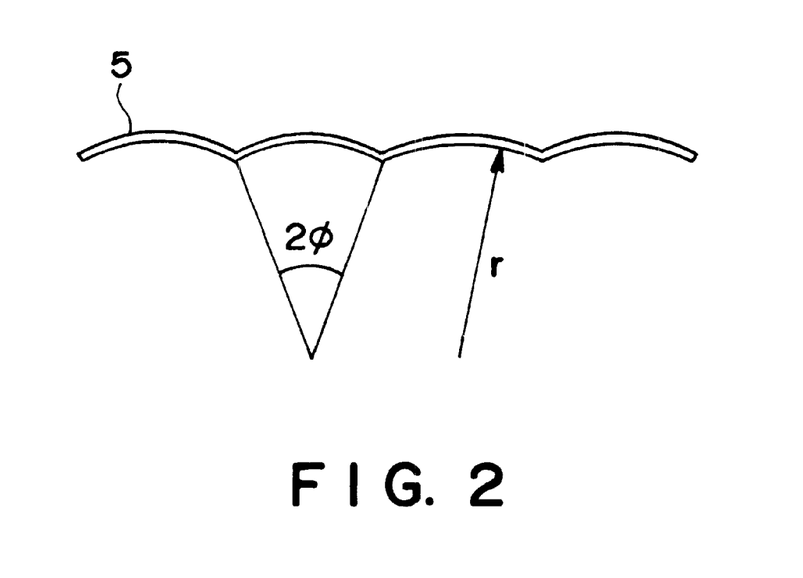
FIG. 2 is a schematic and sectional view of the reflection type integrator having cylindrical surfaces.
Figure 3:
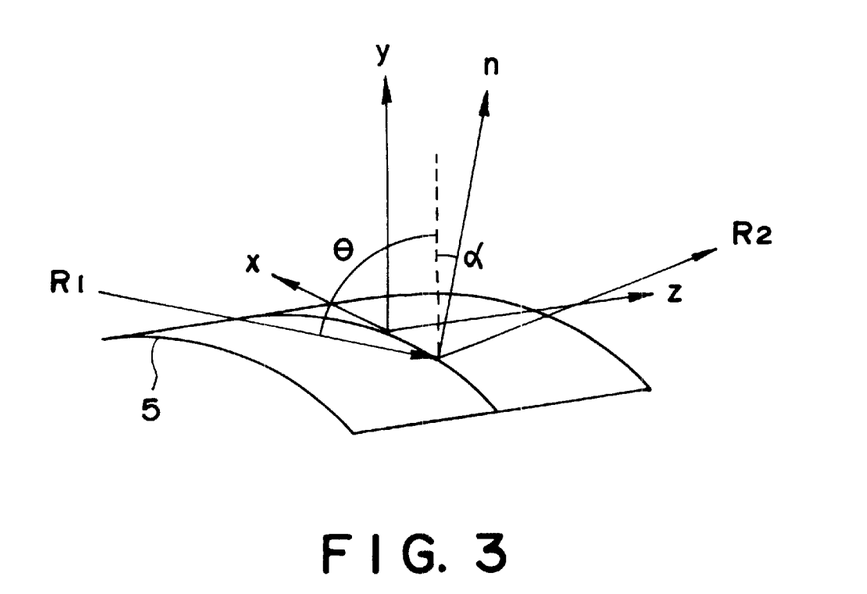
FIG. 3 is a schematic view for explaining reflection of X-rays at a cylindrical surface of a reflection type integrator having convex cylindrical surfaces.
Figure 4:
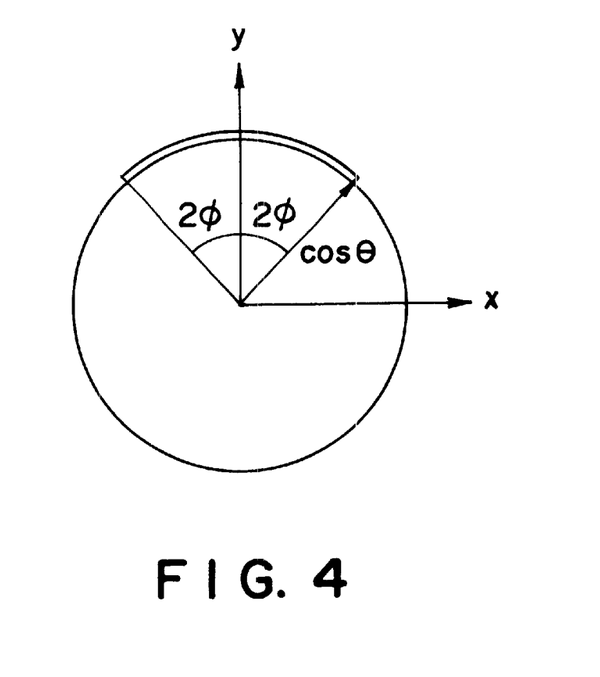
FIG. 4 is a schematic view for explaining an angular distribution of X-rays reflected by a cylindrical surface of a reflection type integrator having cylindrical surfaces.

FIG. 1 is a schematic and perspective view for explaining reflection of parallel light impinging on a reflection type integrator having convex cylindrical surfaces. FIG. 2 is a schematic and sectional view of the reflection type integrator having cylindrical surfaces. FIG. 3 is a schematic view for explaining reflection of X-rays at a cylindrical surface of a reflection type integrator having convex cylindrical surfaces. FIG. 4 is a schematic view for explaining an angular distribution of X-rays reflected by a cylindrical surface of a reflection type integrator having cylindrical surfaces.

In these drawings, denoted at 5 is a reflection type integrator having convex cylindrical surfaces. An X-ray beam of substantially parallel light emitted from an X-ray light source is projected on the reflection type integrator 5 having a plurality of cylindrical surfaces, and secondary light sources are defined by this integrator. The X-rays emitted from these secondary light sources have an angular distribution of a conical surface shape. A reflector having a focal point placed at the secondary light source position reflects the X-rays to illuminate a mask.

For explanation of the function of such a reflection type integrator having cylindrical surfaces, first the action of reflection light in a case where parallel light impinges on one cylindrical surface reflector will be described with reference to FIG. 3. As shown, parallel light is incident on one cylindrical surface at an angle θ with respect to a plane perpendicular to the central axis thereof. If the light ray vector of the projected parallel light is $R1=(0, -\cos \theta, \sin \theta)$ and the vector of a normal to the reflection surface of the cylindrical surface shape is $n=(-\sin \alpha, \cos \alpha, 0)$, then the light ray vector of the reflection light is $R2=(\cos \theta \times \sin 2\alpha, \cos \theta \times \cos 2\alpha, \sin \theta)$.

Here, if the light ray vector of the reflection light is plotted in a phase space, the result is a circle of a radius $\cos \theta$ on an X-Y plane as shown in FIG. 4. That is, the reflection light is formed into divergent light of a conical surface shape, and the secondary light source is located at the position of apex of this conical surface. If the cylindrical surface comprises a concave surface, the secondary light source is placed outside the reflection surface. If the cylindrical surface comprises a convex surface, the secondary light source is placed inside the reflection surface. Also, if the reflection surface is limitedly provided by a portion of a cylindrical surface and the central angle thereof is $2\phi$, then as shown in FIG. 4 the light ray vector of reflection light is arcuate with a central angle $4\phi$ upon the X-Y plane.

Next, a case wherein parallel light is projected on a reflection mirror provided by a portion of a cylindrical surface, wherein a reflection mirror having a focal length f and a focal point placed at the position of this secondary light source, and wherein a mask is placed at the position away from this reflection mirror by a distance f, will be considered. The light emitted from the secondary light source is divergent light and, after it is reflected by the reflection mirror of a focal length f, it is transformed into parallel light. The reflection light here is formed into a sheet beam of an arcuate sectional shape with a central angle 4ø, at a radius f×cos θ. Thus, only an arcuate region upon the mask, having a radius f×cos θ and a central angle 4ø can be illuminated.

While one cylindrical surface reflection mirror has been explained above, a cylindrical surface integrator such as shown in FIG. 1 will now be considered. That is, as shown, parallel light of a diameter D is projected on a reflection mirror of a wider area, having a number of cylindrical surfaces arrayed in parallel in a one-dimensional direction. If the reflection mirror and the mask are disposed in the same manner as in the foregoing example, the angular distribution of light reflected by the reflection mirror, with a number of cylindrical surfaces arrayed in parallel, is essentially the same as in the preceding case. Thus, an arcuate region on the mask with a radius f×cos θ and a central angle 4ø is illuminated. Since the light which impinges on a single point on the mask comes from the whole illumination region on the reflection mirror provided by cylindrical surfaces arrayed in parallel, the angular extension of it is D/f. That is, the numerical aperture of the illumination optical system is D/(2f). If the mask-side numerical aperture of the projection optical system is NAp1, the coherence factor is $$\sigma = D/(2fNAp1).$$

Therefore, in accordance with the thickness (size) of the parallel light, an optimum coherence factor σ can be set.

Next, embodiments of the present invention which use a reflection type integrator with plural cylindrical surfaces will be explained with reference to some drawings.

[Embodiment 1]

Figure 5:
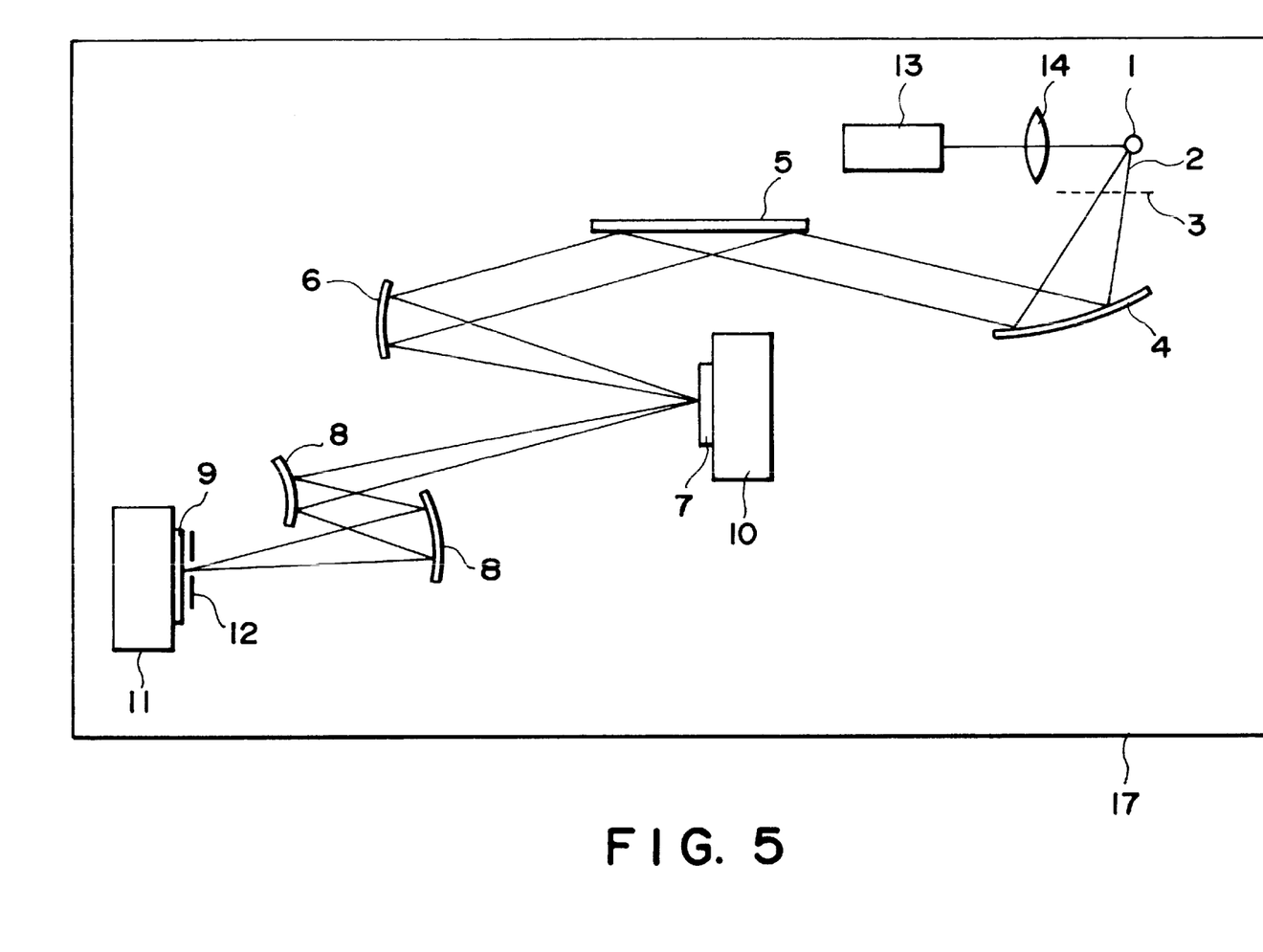
FIG. 5 is a schematic view of an X-ray reduction projection exposure apparatus according to a first embodiment of the present invention.
Figure 6:
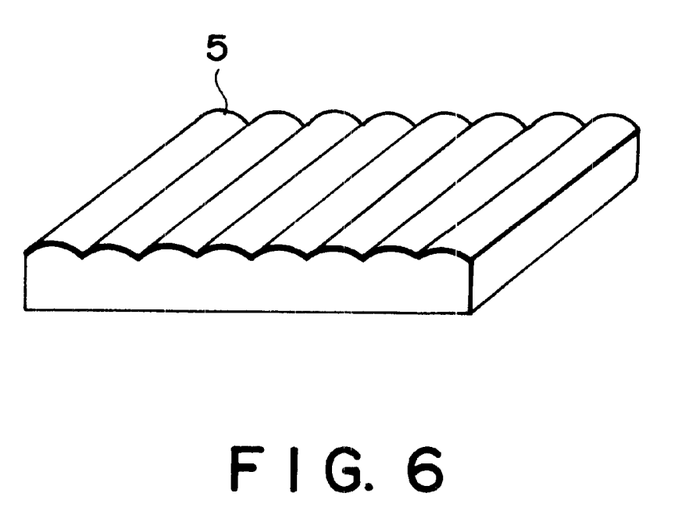
FIG. 6 is a schematic and perspective view of a reflection type integrator with convex cylindrical surfaces, usable in the first embodiment of the present invention.
Figure 7:
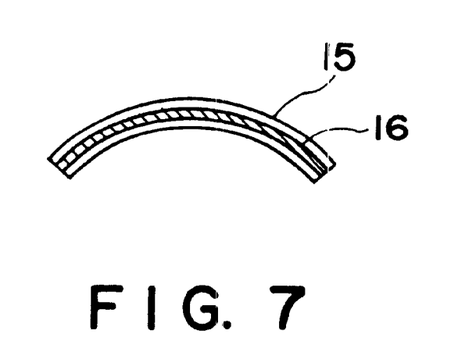
FIG. 7 is a schematic view for explaining an illumination region on the surface of a mask, in the first embodiment of the present invention.

FIG. 5 is a schematic view of an X-ray reduction projection exposure apparatus according to a first embodiment of the present invention. FIG. 6 is a schematic and perspective view of a reflection type integrator with convex cylindrical surfaces, usable in the first embodiment of the present invention. FIG. 7 is a schematic view for explaining an illumination region on the surface of a mask, in the first embodiment of the present invention.

Denoted in these drawings at 1 is a light emission point for X-rays, and denoted at 2 is an X-ray beam. Denoted at 3 is a filter, and denoted at 4 is a first rotational parabolic surface mirror. Denotod at 5 is a reflection type convex cylindrical surface integrator, and denoted at 6 is a second rotatational parabolic surface mirror. Denoted at 7 is a mask, and denoted at 8 is a projection optical system. Denoted at 9 is a wafer, and denoted at 10 is a mask stage. Denoted at 11 is a wafer stage, and denoted at 12 is an arcuate aperture. Denoted at 13 is a laser plasma X-ray light source, and denoted at 14 is a laser collecting optical system. Denoted at 15 is an illumination region on the mask surface, and denoted at 16 is an arcuate region through which the exposure is to be performed. Denoted at 17 is a vacuum chamber.

The X-ray reduction projection exposure apparatus of the first embodiment of the preset invention comprises a laser plasma X-ray light source 13, an illumination optical system, a mask 7, a projection optical system 8, a wafer 9, stages 10 and 11 on which the mask or wafer is placed, an alignment mechanism for precisely aligning the positions of the mask and wafer, a vacuum chamber 17 for keeping the optical arrangement as a whole in a vacuum to prevent X-ray attenuation, and an evacuation device, for example.

The illumination optical system comprises a first rotational parabolic surface mirror 4, a reflection type convex cylindrical surface integrator 5, and a second rotational parabolic surface mirror 6. The mask 7 comprises a multi-layered film reflection mirror on which a transfer pattern is defined by a non-reflective portion, provided by an X-ray absorptive material. The X-ray beam as reflected by the mask 7 is imaged by the projection optical system 8 upon the wafer 9 surface. The protection optical system 7 is so designed that good imaging performance is provided within a narrow arcuate region off the axis. For example, with a reduction magnification of 1:5, good imaging performance is assured with respect to a region on the mask 7 surface at 200 mm off the axis, and to a region on the wafer 9 surface at 40 mm off the axis, with a width of 1 mm. In order that the exposure process is performed only by use of this narrow arcuate region, an aperture 12 having an arcuate opening is disposed just before the wafer 9. For transfer of the pattern on the whole surface of the mask 7 having a rectangular shape, the mask 7 and the wafer 9 are scanningly moved simultaneously, at a predetermined speed ratio. The projection optical system 8 has two multilayered film reflection mirrors, and it serves to project the pattern of the mask 7 onto the wafer 9 in a reduced scale. The reduction magnification corresponds to the scan speed ratio between the mask and the wafer. The projection optical system 8 comprises a telecentric system.

The X-ray beam 2 emitted from the light emission point 1 of the laser plasma X-ray source 13 passes a shield filter 3 of the target, for prevention of particle scattering, and it is reflected by the first rotational parabolic surface mirror 4, whereby it is transformed into a parallel beam. This beam is then reflected by the reflection type integrator 5 with convex cylindrical surfaces, whereby a number of secondary light sources are produced. The X-rays from these secondary light sources are reflected by the second rotational parabolic surface mirror 6, and they illuminate the mask 7. Both of the distance from the secondary light source to the second rotational parabolic surface mirror 6 and the distance from the second parabolic surface mirror 6 to the mask 7 are equal to the focal length of the second rotational parabolic surface mirror. Thus, the conditions for Koehler illumination are satisfied.

The reflection type convex cylindrical surface integrator 5 comprises a total reflection mirror having a shape that a number of small convex cylindrical surfaces are arrayed one-dimensionally such as shown in FIG. 6. In the sectional shape of the integrator 5, each arcuate portion has a radius of 0.5 mm and a central angle of 30 deg. When parallel light impinges on it, on a plane inside the reflection surface at a distance of 0.25 mm, there is formed a virtual image of linear secondary light sources, arrayed in parallel, that is, of the laser plasma X-ray light source 13.

In this embodiment, the parallel X-ray beam has a thickness of 20 mm, and the incidence angle of the parallel X-ray beam upon-the integrator 5 is 85 deg. The second rotational parabolic surface mirror 6, having a focal length f=2300 mm, has its focal point disposed at the position of the secondary light sources, as the linear secondary light sources arrayed in parallel are defined on a plane spaced by 0.25 mm from the reflection surface when parallel light is projected on the integrator 5. Also, the mask 7 is disposed at a distance 2300 mm from the second rotational parabolic surface mirror 6. Light emitted from one point on the secondary light source is divergent light having an angular distribution like a conical surface. It is reflected by the second rotational parabolic surface mirror 6 having a focal length f=2300 mm, and it is transformed into parallel light. Then, as shown in FIG. 7, an arcuate region 16 on the mask 7 having a radius 2300 mm×cos 85(deg)=200 mm and a central angle 30 deg.×2=60 deg. is illuminated. Here, the numerical aperture of the illumination optical system is 20/(2×2300)=0.0043. If the numerical aperture of the projection optical system is 0.01 on the mask side and 0.05 on the wafer side, the coherence factor is 0.43. On the mask 7 surface, an arcuate region 16 of a radius 200 mm and a central angle 60 deg. is illuminated, and the pattern within this region is projected in a reduced scale onto the resist surface of the wafer 9. If the reduction magnification is 1:5, an arcuate region on the wafer 9 having a radius 40 mm and central angle 60 deg. is illuminated at once. With the scan of the mask 7 and the wafer 9, a square region of 40 mm square, for example, can be exposed with good precision.

As described, this embodiment uses a reflection type convex cylindrical surface integrator 5 having a reflection surface provided by a number of small convex cylindrical surfaces arrayed one-dimensionally, by which the region on the mask 7 to be illuminated can be defined with an arcuate shape and, simultaneously, an optimum value for a coherence factor of the illumination optical system can be set. Also, the shape of the illumination region 15 on the mask 7 surface is restricted to the vicinity of the arcuate region 16 with which the exposure process is performed actually. Wasteful illumination of X-rays to a wide area outside the exposure region, such as shown in FIG. 14, is prevented. Thus, the loss of light quantity is reduced, the exposure time can be shortened and throughput can be improved.

[Embodiment 2]

Figure 8:
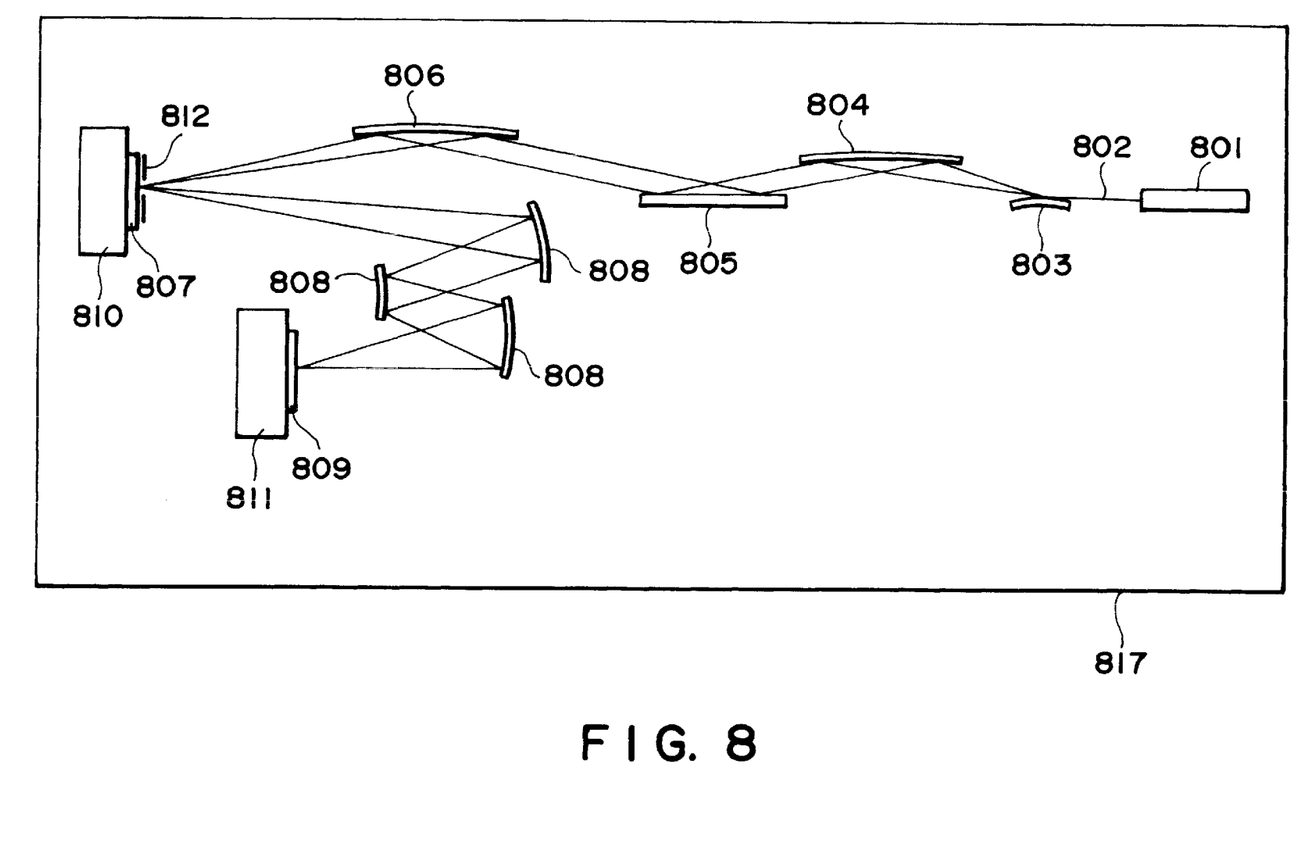
FIG. 8 is a schematic view of an X-ray reduction projection exposure apparatus according to a second embodiment of the present invention.
Figure 9:
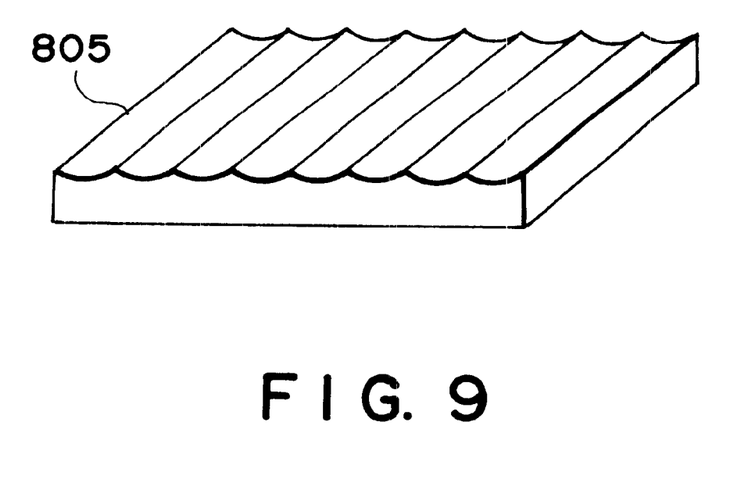
FIG. 9 is a schematic and perspective view of a reflection type integrator with concave cylindrical surfaces, usable in the second embodiment of the present invention.

FIG. 8 is a schematic view of an X-ray reduction projection exposure apparatus according to a second embodiment of the present Invention. FIG. 9 is a schematic and perspective view of a reflection type integrator with concave cylindrical surfaces, usable in the second embodiment of the present invention.

Denoted in these drawings at 801 is an undulator X-ray light source, and denoted at 802 is an X-ray beam. Denoted at 803 is a convex surface mirror, and denoted at 804 is a first concave surface mirror. Denoted at 805 is a reflection type integrator with concave cylindrical surfaces, and denoted at 806 is a second concave surface mirror Denoted at 807 is a mask, and denoted at 808 is a projection optical system. Denoted at 809 is a wafer. Denoted at 810 is a mask stage, and denoted at 811 is a wafer stage. Denoted at 812 is an arcuate aperture, and denoted at 817 is a vacuum chamber.

The X-ray reduction projection exposure apparatus according to the second embodiment of the present invention comprises an undulator X-ray light source 801, an illumination optical system, a mask 807, a projection optical system 808, a wafer 809, stages 810 and 811 having the mask or wafer placed thereon, an alignment mechanism for precisely aligning the positions of the mask and wafer, a vacuum chamber for keeping the optical arrangement as a whole in a vacuum for prevention of X-ray attenuation, and an evacuation device, for example.

The illumination optical system of this embodiment comprises an undulator X-ray light source 801, a convex surface mirror 803, a first concave surface mirror 804, a reflection type concave cylindrical surface integrator 805, and a second concave surface mirror 806.

The mask 807 comprises a multilayered film reflection mirror on which a transfer pattern is defined by a non-reflective portion, provided by an X-ray absorptive material. The X-ray beam as reflected by the mask 807 is imaged by the projection optical system 808 upon the wafer 809 surface. The projection optical system 808 is so designed that good imaging performance is provided in a narrow arcuate region off the axis. In order that the exposure process is performed only by use of this narrow arcuate region, an aperture 812 having an arcuate opening is disposed just before the wafer 809. For transfer of the pattern on the whole surface of the mask 807 having a rectangular shape, the mask 807 and the wafer 809 are scanningly moved simultaneously. The projection optical system 808 has three multilayered film reflection mirrors, and it serves to project the pattern of the mask 807 onto the wafer 809 in a reduced scale.

The X-ray beam 802 emitted from the light emission point of the undulator X-ray light source 801 is a narrow and substantially parallel beam. It is reflected by the convex surface mirror 803 and the first concave surface mirror 804, whereby it is transformed into a thick parallel beam. This beam is reflected by the reflection type concave cylindrical surface integrator 805 of the structure that concave cylindrical surfaces with multilayered films for increased X-ray reflectivity are arrayed in parallel. By this, a number of secondary light sources are produced. Light emitted from a single point on the secondary light source is divergent light of a conical surface shape and, after being reflected by the second concave surface mirror 806, it is transformed into parallel light. Then, an arcuate region on the mask 807 is illuminated.

As described above, this embodiment uses a reflection type concave cylindrical surface integrator 805 having a number of small concave cylindrical surfaces arrayed one-dimensionally, by which the region on the mask 807 to be illuminated can be made arcuate and, additionally, an optimum value for the coherence factor of the illumination optical system can be set. Also, the shape of the illumination region on the mask 807 surface is restricted to an arcuate region with which the exposure is to be done actually. Wasteful X-ray illumination to those areas outside the exposure region is prevented. Thus, the loss of light quantity is reduced, the exposure time can be shortened and the throughput can be improved.

The X-ray illumination optical system and X-ray reduction exposure apparatus described above assure, with use of a reflection type integrator having a reflection mirror of a wide area provided by a number of cylindrical surfaces arrayed in parallel, illumination of only an arcuate region on a mask. Also, it enables setting the numerical aperture of the illumination system to provide an optimum coherent factor σ.

The shape of the illumination region on the mask is restricted to an arcuate region with which the exposure is to be done actually, and wasteful X-ray illumination to those areas other than the exposure region is prevented. Thus, loss of light quantity is reduced, the exposure time can be shortened and the throughput can be enhanced.

The reflection surface of the reflection type integrator may be provided with a multilayered film, to provide higher X-ray reflectivity.

[Embodiment of a Device Manufacturing Method]

Next, an embodiment of a device manufacturing method for producing semiconductor devices, for example, which uses an exposure apparatus such as described above, will be explained.

Figure 10:
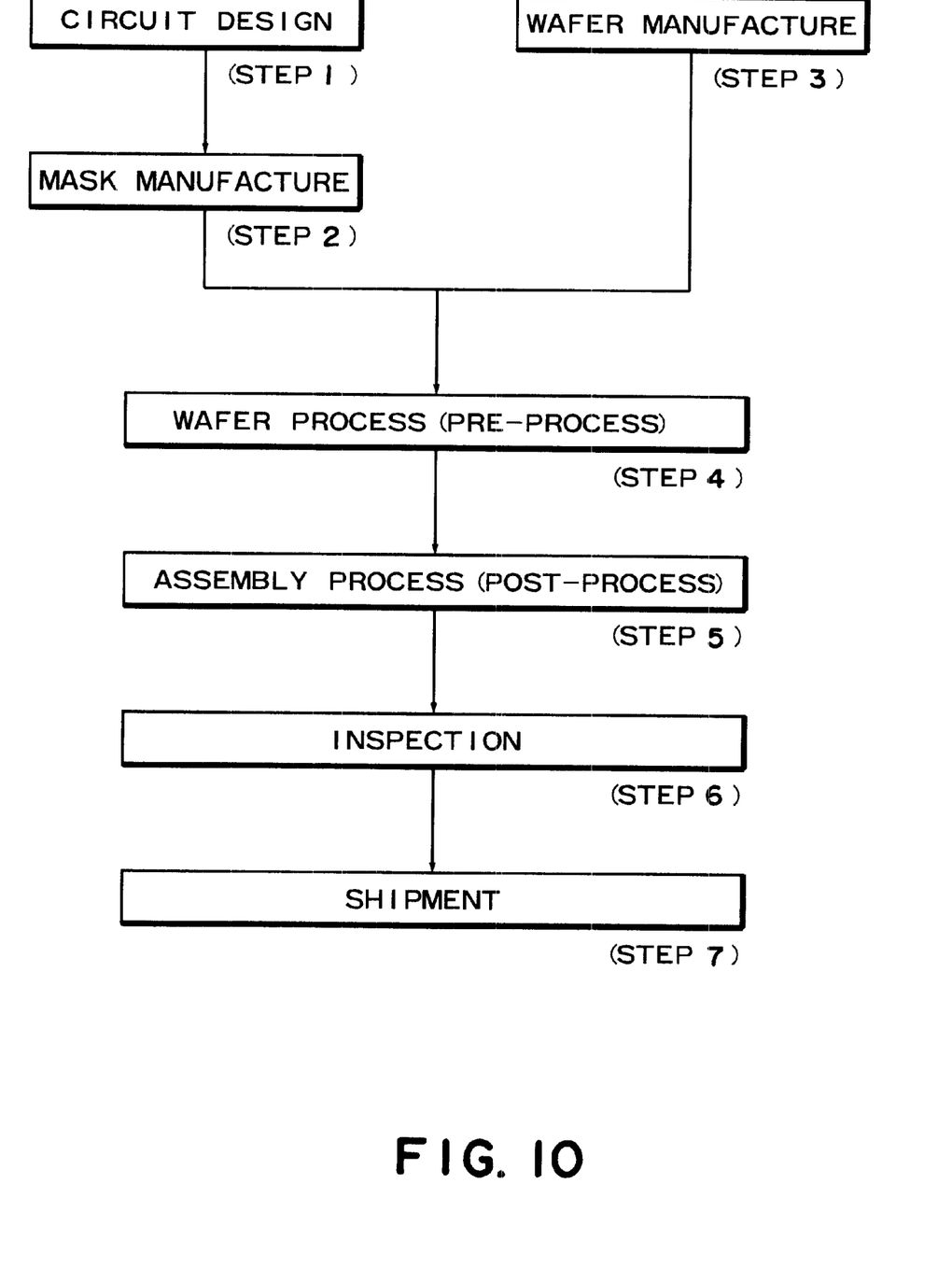
FIG. 10 is a flow chart of microdevice manufacturing processes.

FIG. 10 is a flow chart of a procedure for the manufacture of microdevices such as semiconductor chips (e.g., ICs or LSIs), liquid crystal panels, and CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 11:
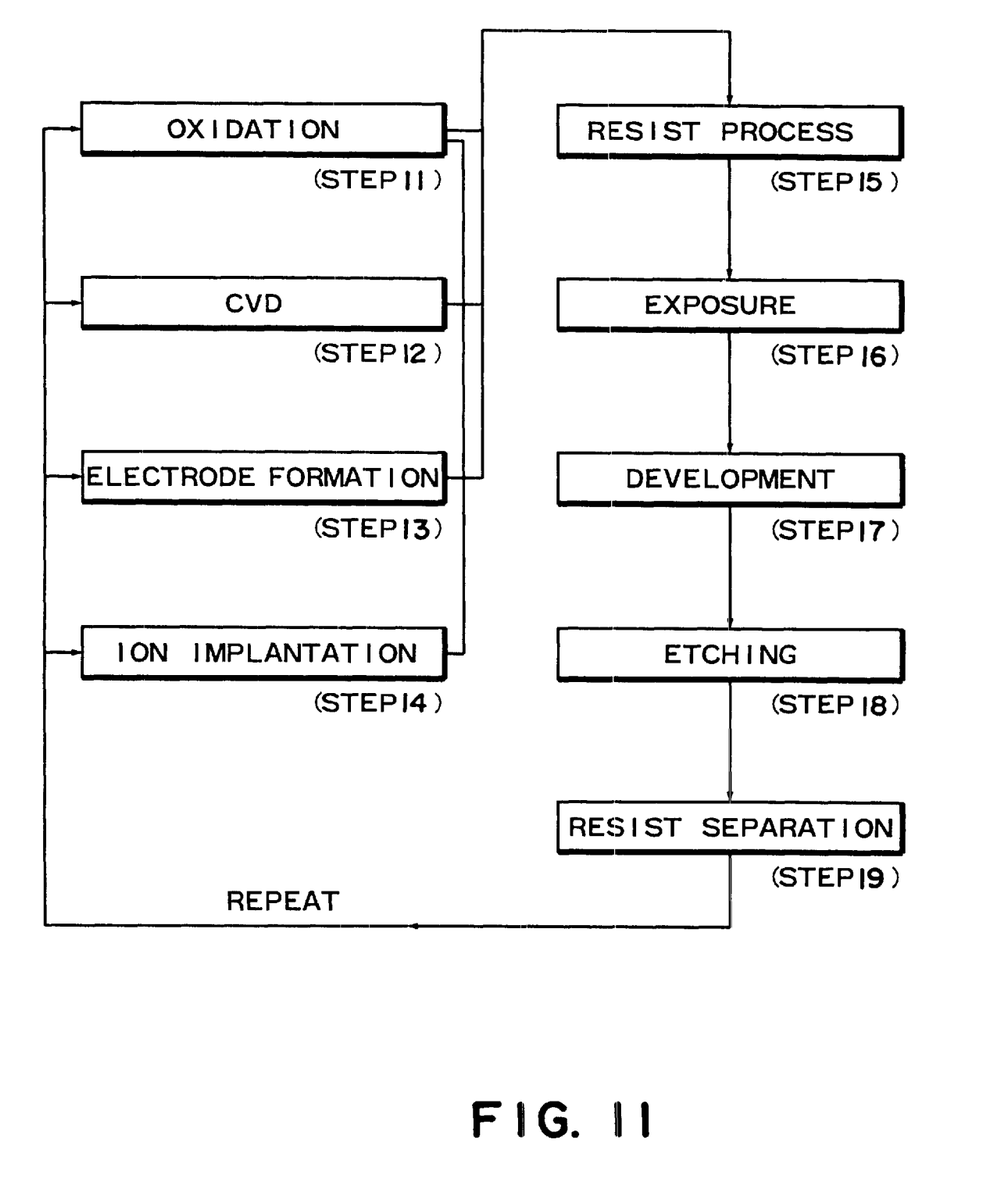
FIG. 11 is a flow chart of a wafer process.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An illumination system comprising:
    a reflection type integrator having cylindrical surfaces, for reflecting light from a light source; and
    a condensing optical system for reflecting the light reflected by said cylindrical surfaces, and for illuminating an object, with the light, in an oblique direction with respect to a surface of the object.

2. An illuminating system comprising:
    a reflection type integrator having plural cylindrical surfaces, each cylindrical surface having a function for transforming light from a light source into light having a section of an arcuate shape; and
    a condensing optical system for superposing lights having arcuate sectional shapes, from said reflection type integrator, one upon another on an object.

3. An X-ray exposure apparatus comprising:
    an X-ray illumination optical system having (i) a reflection type integrator, with cylindrical surfaces, for reflecting an X-ray beam and (ii) a concave mirror arranged so as to reflect the X-ray beam reflected by said cylindrical surfaces and to illuminate a reflection type mask with the X-ray beam in an oblique direction with respect to a surface of the reflection type mask; and
    an X-ray projection optical system arranged so as to project a pattern of the reflection type mask with an X-ray beam reflected obliquely by the reflection type mask, onto a surface of a piece onto which the pattern is to be transferred.

4. An apparatus according to claim 3, further comprising a scanning mechanism for relatively and scanningly moving the mask and the piece relative to said X-ray projection optical system.

5. An apparatus according to claim 3, further comprising another concave mirror for projecting a parallel X-ray beam onto said integrator.

6. An apparatus according to claim 3, wherein said reflection type integrator provides a secondary light source of X-rays, and said concave mirror has a focal point disposed at the position of said secondary light source.

7. An apparatus according to claim 3, further comprising a stage for holding the reflection type mask thereon, wherein said stage, said reflection type integrator, and said concave mirror are arranged so that the X-ray beam is projected to the reflection type mask held by said stage, via said reflection type integrator and said concave mirror such that an illumination region of the X-ray beam defined on the reflection type mask has a rectangular shape.

8. An apparatus according to claim 3, wherein said reflection type integrator has a reflection surface having a multilayered film formed thereon.

9. An apparatus according to claim 3, further comprising a laser plasma X-ray source for emitting an X-ray beam.

10. An X-ray illumination apparatus, comprising:
    a reflection type integrator, having cylindrical surfaces, for reflecting an X-ray beam; and
    a concave mirror arranged so as to reflect the X-ray beam reflected by said cylindrical surfaces and to illuminate an object with the X-ray beam in an oblique direction with respect to a surface of the object.

11. An apparatus according to claim 10, further comprising another concave mirror for projecting a parallel X-ray beam onto said integrator.

12. An apparatus according to claim 10, wherein said reflection type integrator provides a secondary light source of X-rays, and said concave mirror has a focal point disposed at the position of said secondary light source.

13. An apparatus according to claim 10, wherein said reflection type integrator has a reflection surface having a multilayered film formed thereon.

14. An apparatus according to claim 10, further comprising a laser plasma X-ray source for emitting an X-ray beam.

15. A device manufacturing method, comprising the steps of:
    setting a reflection type mask having a pattern and a piece with respect to an X-ray exposure apparatus, wherein the X-ray exposure apparatus includes (1) an X-ray illumination optical system having (i) a reflection type integrator with cylindrical surfaces, for reflecting an X-ray beam and (ii) a concave mirror arranged so as to reflect the X-ray beam reflected by the cylindrical surfaces and to illuminate a reflection type mask with the X-ray beam in an oblique direction with respect to a surface of the reflection type mask, and (2) an X-ray projection optical system arranged so as to project the pattern of the reflection type mask with an X-ray beam reflected obliquely by the reflection type mask, onto a surface of the piece; and
    projecting the pattern onto the piece via the projection optical system, such that a circuit pattern is defined on the piece.

16. An illumination system comprising:
   a reflection type integrator having plural cylindrical surfaces, each cylindrical surface having a function for transforming an X-ray beam from an X-ray source into an X-ray beam having a section of an arcuate shape; and
   a concave mirror for superposing X-ray beams having arcuate sectional shapes from said reflecting type integrator, one upon another on an object.

17. An illumination system according to claim 16, wherein the object is a reflection type mask, and the mask is illuminated obliquely.

18. An illumination system according to claim 16, wherein a plane of incidence for incidence of the X-ray beam from the X-ray source upon said reflection type integrator is parallel to a generating line of each cylindrical surface.

19. An illumination system according to claim 16, wherein said concave mirror comprises a rotational parabolic surface mirror.

20. An illumination system according to claim 16, further comprising another concave mirror for projecting a parallel X-ray beam onto said integrator.

21. An illumination system according to claim 16, wherein said reflection type integrator provides a secondary light source of X-rays, and said concave mirror has a focal point disposed at the position of said secondary light source.

22. An illumination system according to claim 16, wherein said reflection type integrator has a reflection surface having a multilayered film formed thereon.

23. An illumination system according to claim 16, wherein the X-ray source comprises a laser plasma X-ray source.

24. An illumination system according to claim 16, wherein the X-ray beam is a soft X-ray beam.

25. An X-ray exposure apparatus comprising:
   an illumination system including (i) a reflection type integrator having plural cylindrical surfaces, each cylindrical surface having a function for transforming an X-ray beam from an X-ray source into an X-ray beam having a section of an arcuate shape, and (ii) a concave mirror for superposing X-ray beams having arcuate sectional shapes, from said reflection type integrator, one upon another on a reflection type mask; and
   a projection optical system for projecting a pattern of the reflection type mask onto a wafer, by use of X-rays reflected, by the reflection type mask, obliquely with respect to the surface of the refection type mask.

26. An apparatus according to claim 25, further comprising a scanning mechanism for relatively and scanningly moving the mask and an object relative to said projection optical system.

27. An apparatus according to claim 25, further comprising another concave mirror for projecting a parallel X-ray beam onto said integrator.

28. An apparatus according to claim 25, wherein said reflection type integrator provides a secondary light source of X-rays, and said concave mirror has a focal point disposed at the position of said secondary light source.

29. An illumination system according to claim 25, wherein said reflection type integrator has a reflection surface having a multilayered film formed thereon.

30. An illumination system according to claim 25, wherein the X-ray source comprises a laser plasma X-ray source.

31. A device manufacturing method, comprising the steps of:
   exposing a wafer with a pattern of a reflection type mask, by use of an exposure apparatus which includes (i) an illumination system having (a) a reflection type integrator having plural cylindrical surfaces, each cylindrical surface having a function for transforming an X-ray beam from an X-ray source into an X-ray beam having a section of an arcuate shape, and (b) a concave mirror for superposing X-ray beams having arcuate sectional shapes, from the reflection type integrator, one upon another on the reflection type mask, and (ii) a projection optical system for projecting the pattern of the reflection type mask onto the wafer, by use of X-rays reflected, by the reflection type mask, obliquely with respect to the surface of the reflection type mask; and
   developing the exposed wafer.

* * * * *

UNITED STATES PATENT AND TRADEMARK OFFICE
CERTIFICATE OF CORRECTION

PATENT NO. : 6,504,896 B2  Page 1 of 1
DATED : January 7, 2003
INVENTOR(S) : Akira Miyake et al.

It is certified that error appears in the above-identified patent and that said Letters Patent is hereby corrected as shown below:

Column 2,
Line 32, "2×NAp2/σ" should read -- 2×NAp2/λ --.

Column 4,
Line 56, "of apex" should read -- of an apex --.

Column 5,
Line 64, "preset" should read -- present --.

Column 6,
Line 49, "having" should read -- having such --.

Column 7,
Line 37, "Invention" should read -- invention --.
Line 46, "mirror" should read -- mirror. --.

Signed and Sealed this

Thirtieth Day of September, 2003

JAMES E. ROGAN
*Director of the United States Patent and Trademark Office*